(12) United States Patent
Ohshima

(10) Patent No.: US 7,705,377 B2
(45) Date of Patent: Apr. 27, 2010

(54) FIELD EFFECT TRANSISTOR COMPRISING COMPOUND SEMICONDUCTOR

(75) Inventor: Tomoyuki Ohshima, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 554 days.

(21) Appl. No.: 11/528,321

(22) Filed: Sep. 28, 2006

(65) Prior Publication Data

US 2007/0075333 A1    Apr. 5, 2007

(30) Foreign Application Priority Data

Sep. 30, 2005    (JP)    ............................. 2005-287778

(51) Int. Cl.
   *H01L 29/812*    (2006.01)
(52) U.S. Cl. .............................. 257/284; 257/E29.041; 438/571
(58) Field of Classification Search .......... 257/E29.041, 257/284; 438/571
See application file for complete search history.

(56) References Cited

U.S. PATENT DOCUMENTS

| | | | | |
|---|---|---|---|---|
| 6,342,411 B1 * | 1/2002 | Pitts, Jr. | ....................... | 438/173 |
| 6,624,440 B2 * | 9/2003 | Bito et al. | ...................... | 257/20 |
| 6,747,297 B2 * | 6/2004 | Tanabe | ....................... | 257/194 |

FOREIGN PATENT DOCUMENTS

| | | |
|---|---|---|
| JP | 09-045894 | 2/1997 |
| JP | 2004-193273 | 7/2004 |

\* cited by examiner

*Primary Examiner*—Allan R. Wilson
(74) *Attorney, Agent, or Firm*—Volentine & Whitt, P.L.L.C.

(57)    ABSTRACT

A field effect transistor having a double recess structure, which minimizes an influence exerted on a channel region depending upon the surface state of an outer recess section. In the field effect transistor having such a double recess structure, an ohmic contact layer at the surface of the outer recess section is made to have a thickness so as to be in a to completely depleted state.

4 Claims, 8 Drawing Sheets

FIELD EFFECT TRANSISTOR COMPRISING COMPOUND SEMICONDUCTOR

BACKGROUND OF THE INVENTION

The present invention relates to a field effect transistor constituted of a compound semiconductor, and particularly to a field effect transistor having a double recess structure.

In a field effect transistor (FET), a double recess structure is widely used for the purpose of improvement in breakdown voltage. The double recess structure means a structure in which recesses of two steps are formed around a gate electrode. The recess provided outside is called an outer recess section, and the recess provided inside is called an inner recess section.

A general compound semiconductor FET having a double recess structure has a structure wherein an undoped AlGaAs buffer layer, an InGaAs channel layer, an undoped AlGaAs spacer layer, an Si doped AlGaAs carrier supply layer, an undoped AlGaAs Schottky contact layer, and an Si doped GaAs ohmic contact layer, which are respectively epitaxial layers, are respectively sequentially deposited over a semi-insulating GaAs substrate. An outer recess section is formed by removing the Si doped GaAs ohmic contact layer by etching, and an inner recess section is formed by removing the surface of the undoped AlGaAs Schottky contact layer exposed to within the outer recess section by etching, respectively. Further, ohmic electrodes are provided on the Si doped GaAs ohmic contact layer, and a gate electrode is provided on the undoped AlGaAs Schottky contact layer lying in the inner recess section, respectively.

Since a field intensity lying within the channel layer at the application of a voltage is reduced in the FET having such a double recess structure, an improvement in the breakdown voltage of a transistor can be expected. As other examples of the compound semiconductor FET having the double recess structure, there have been known examples described in patent documents (Japanese Unexamined Patent Publication No. Hei 9(1997)-45894, Japanese Unexamined Patent Publication No. Hei 11(1999)-214676, and Japanese Unexamined Patent Publication No. 2004-193273).

However, the compound semiconductor FET having the double recess structure is unstable in transistor characteristics because the transistor characteristics thereof greatly depend on the surface state at the outer recess section. This results from the following reasons:

In the compound semiconductor FET having the double recess structure, the surface of the outer recess section is of a compound semiconductor. In general, a high-density surface level ranging from about $10^{11}$ cm$^{-2}$ to $10^{13}$ cm$^{-2}$ exists in the surface of the compound semiconductor. Its surface state density greatly varies according to the adhesion of dust, the condition of the process for the surface, and the like. In the compound semiconductor FET having the double recess structure, a depletion layer expands below the outer recess section, and the width of the depletion layer also changes when the surface state density of the outer recess section changes. Since a channel layer placed below the depletion layer is narrowed when the width of the depletion layer is enlarged, a drain current decreases. Since the channel layer expands when the width of the depletion layer is scaled down in reverse, a drain current increases.

SUMMARY OF THE INVENTION

With the foregoing in view, it is an object of the present invention to provide a field effect transistor having a double recess structure, which minimizes an influence exerted on a channel region depending upon the condition of the surface of an outer recess section. According to one aspect of the present invention, for attaining the above object, there is provided a field effect transistor comprising:

a buffer layer;

a channel layer formed on the buffer layer;

a spacer layer formed on the channel layer;

a carrier supply layer formed on the channel layer;

a Schottky contact layer formed on the carrier supply layer;

first and second ohmic contact layers formed on the Schottky contact layer; and a gate electrode disposed with being interposed between the first and second ohmic contact layers, wherein the first and second ohmic contact layers have portions adjacent to the gate electrode, which constitute recess sections, and wherein each of the first and second ohmic contact layers of the recess sections has a completely depleted thickness.

In the field effect transistor according to the present invention, the top layer of the outer recess section is of a high-concentration ohmic contact layer, and the ohmic contact layer is provided so as to be completely depleted. In other words, a high-concentration space charge is formed within the ohmic contact layer. Thus, even when a surface state density changes due to the adhesion of impurities to the surface of the ohmic contact layer of the outer recess section, or the like, the change in surface state density is absorbed into the space charge lying within the ohmic contact layer. It is thus possible to suppress a change in the width of a depletion layer and minimize the influence of the change in the surface state density of the surface of the ohmic contact layer of the outer recess section, which is exerted on a channel region.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
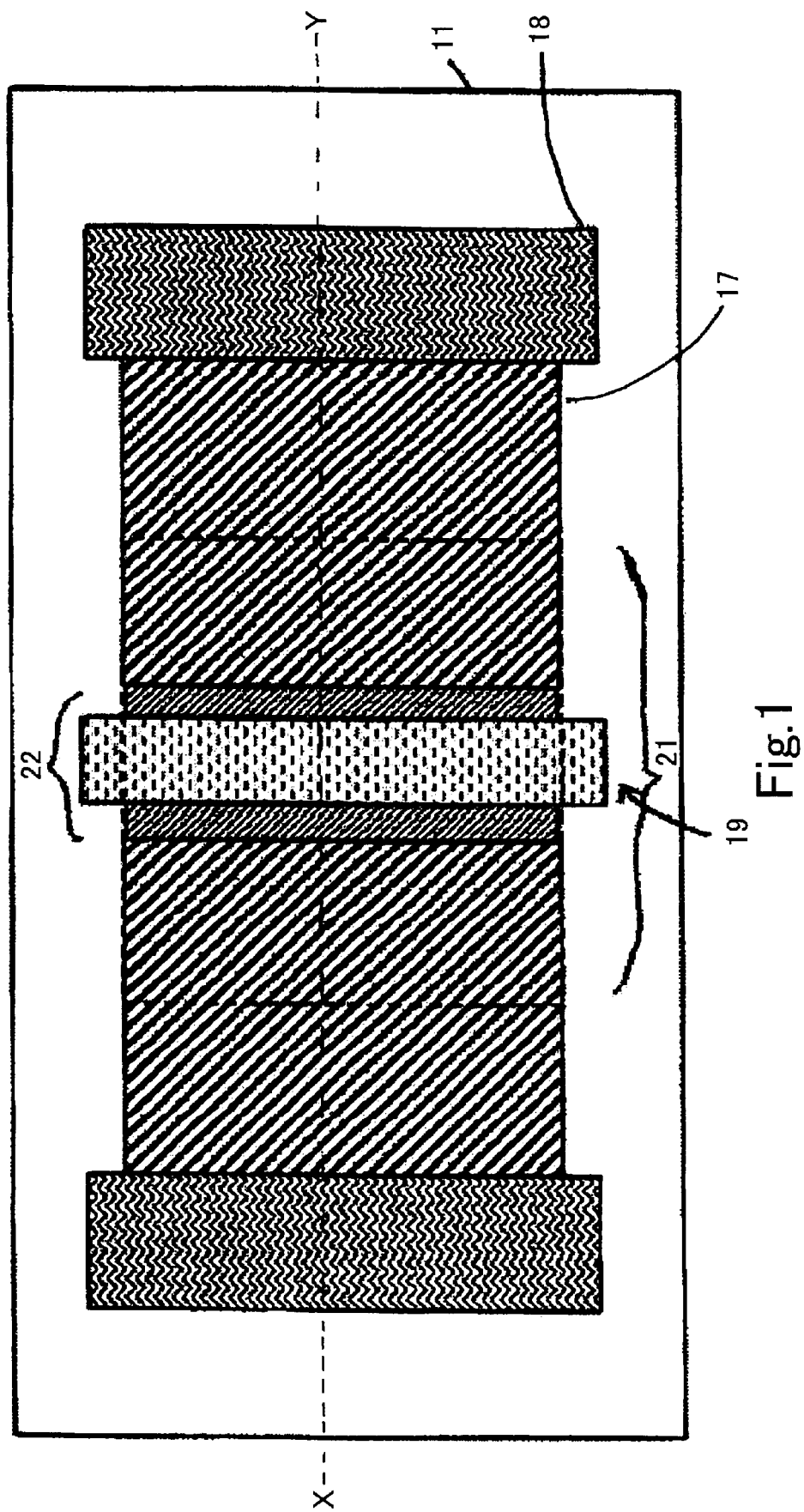
FIG. 1 is a plan view showing a field effect transistor according to a first embodiment of the present invention.

Preferred embodiments of the present invention will hereinafter be described with reference to the accompanying drawings. Incidentally, the size, shape and physical relationship of each constituent element or component in the figures are merely approximate illustrations to enable an understanding of the present invention. Identical constituent elements are given the same reference numerals, and their dual explanations might be omitted.

First Preferred Embodiment

Figure 2:
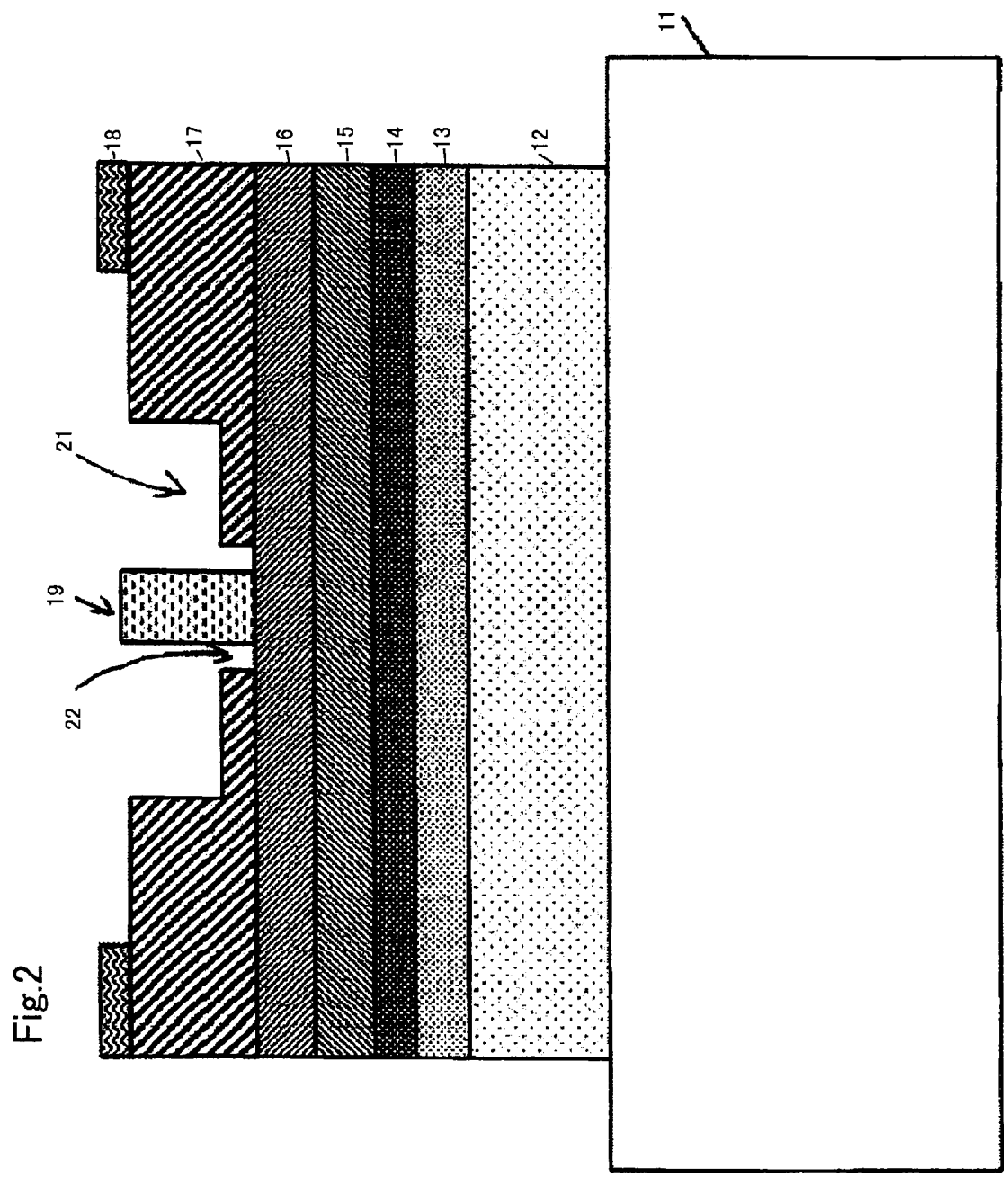
FIG. 2 is a sectional view showing the field effect transistor according to the first embodiment of the present invention.

FIGS. 1 and 2 are respectively a plan view and a sectional view showing a compound semiconductor field effect transistor (FET) having a double recess structure, which shows a first embodiment of the present invention. FIG. 2 is a cross-section cut along a dotted line X-Y of FIG. 1. The first embodiment of the present invention will be explained below using FIGS. 1 and 2.

The FET according to the first embodiment has a structure wherein an undoped $In_{0.52}Al_{0.48}As$ buffer layer (400 nm thick) 12, an undoped $In_{0.53}Ga_{0.47}As$ channel layer (15 nm thick) 13, an undoped $In_{0.52}Al_{0.48}As$ spacer layer (2 nm thick) 14, an Si doped $In_{0.52}Al_{0.48}As$ carrier supply layer ($1\times10^{19}$ $cm^{-3}$ in concentration and 5 nm in thickness) 15, an undoped $In_{0.52}Al_{0.48}As$ Schottky contact layer (15 nm thick) 16 and an Si doped $In_{0.53}Ga_{0.47}As$ ohmic contact layer ($3\times10^{18}$ $cm^{-3}$ in concentration and 20 nm in thickness) 17 respectively corresponding to epitaxial layers grown by a molecular beam epitaxial method are sequentially deposited over a substrate 11 comprised of a semi-insulating InP or GaAs.

Further, the FET according to the first embodiment has an outer recess section 21 and an inner recess section 22. The outer recess section 21 is formed by removing the surface of the ohmic contact layer 17 by etching. The thickness of the ohmic contact layer 17 having remained here is 3 nm. The inner recess section 22 is formed by further removing the outer recess section 21 by etching and thereby exposing the Schottky contact layer 16.

Ohmic electrodes 18 each made up of AuGe (10 nm thick), Ni (10 nm thick), Au (100 nm thick) and the like are formed on the ohmic contact layers 17 on both sides of the outer recess section 21 with the outer recess section 21 interposed therebetween. A gate electrode 19 made up of Ti (50 nm thick), Pt (50 nm thick), Au (500 nm thick) and the like is formed on the Schottky contact layer 16 lying within the inner recess section 22.

In the FET according to the first embodiment of the present invention, the outer recess section is of an Si doped $In_{0.53}Ga_{0.47}As$ ohmic contact layer having a concentration of $3\times10^{18}$ $cm^{-3}$ and a thickness of 3 nm. In particular, the top layer of the outer recess section is of a high-concentration ohmic contact layer, which is configured such that the outer recess section is completely depleted. Thus, since a high-concentration space charge is formed in the ohmic contact layer even when a surface state density changes depending upon the condition of the surface of the outer recess section, a change in the width of a depletion layer can be suppressed, thus making it possible to minimize the influence exerted on a channel region.

Incidentally, the thickness for completely depleting the ohmic contact layer left in the outer recess section can be calculated from the Poisson equation using a surface potential, a doping concentration, and a dielectric constant of the ohmic contact layer. In the case of GaAs having a concentration of $1\times10^{19}$ $cm^{-3}$, for example, the thickness depleted by its surface potential becomes about 8.3 nm when the surface potential is 0.4V. Thus, when it is taken as the ohmic contact layer, it is assumed to be a thickness of 8.3 nm or less.

Second Preferred Embodiment

Figure 3:
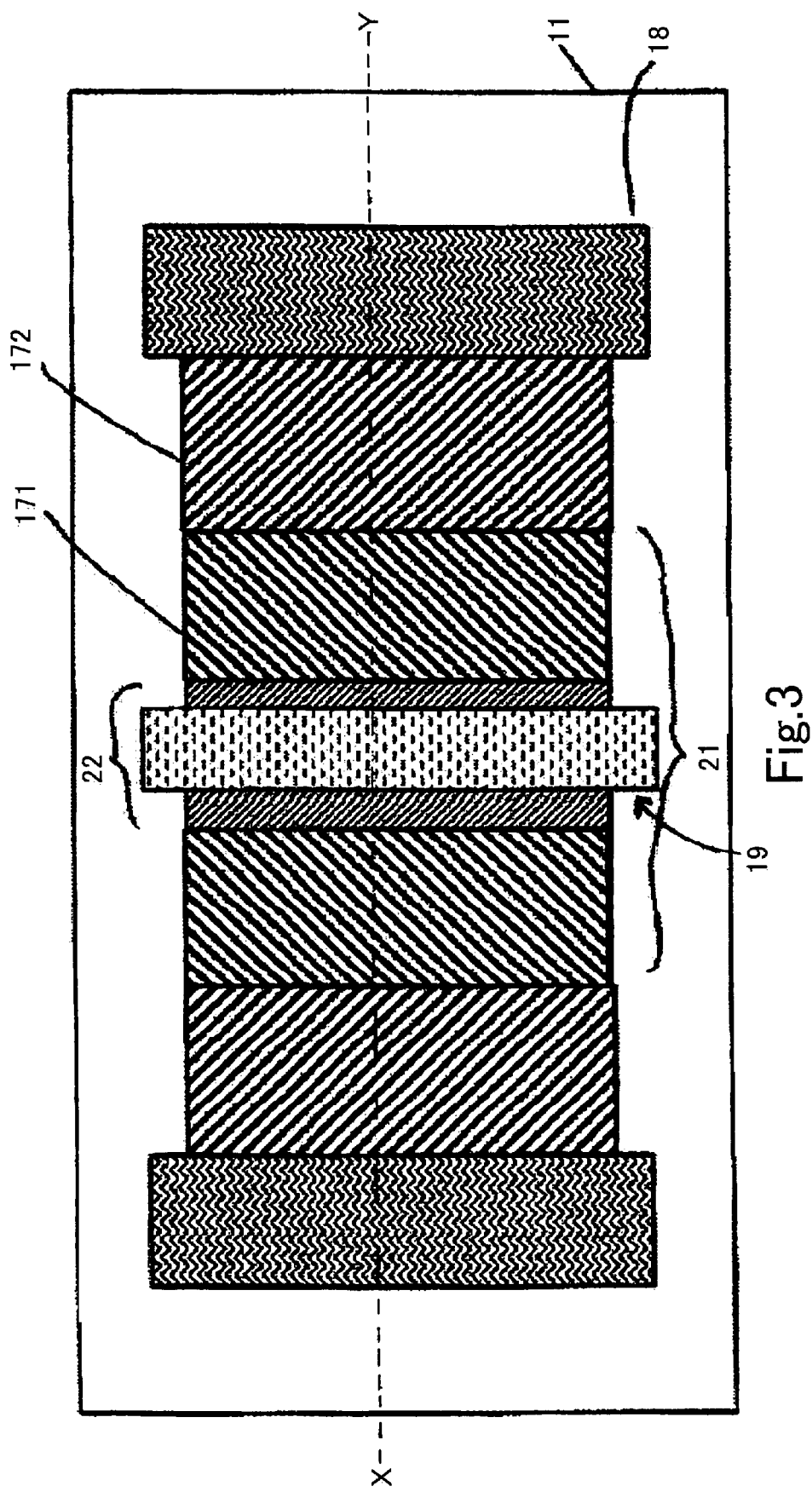
FIG. 3 is a plan view illustrating a field effect transistor according to a second embodiment of the present invention.
Figure 4:
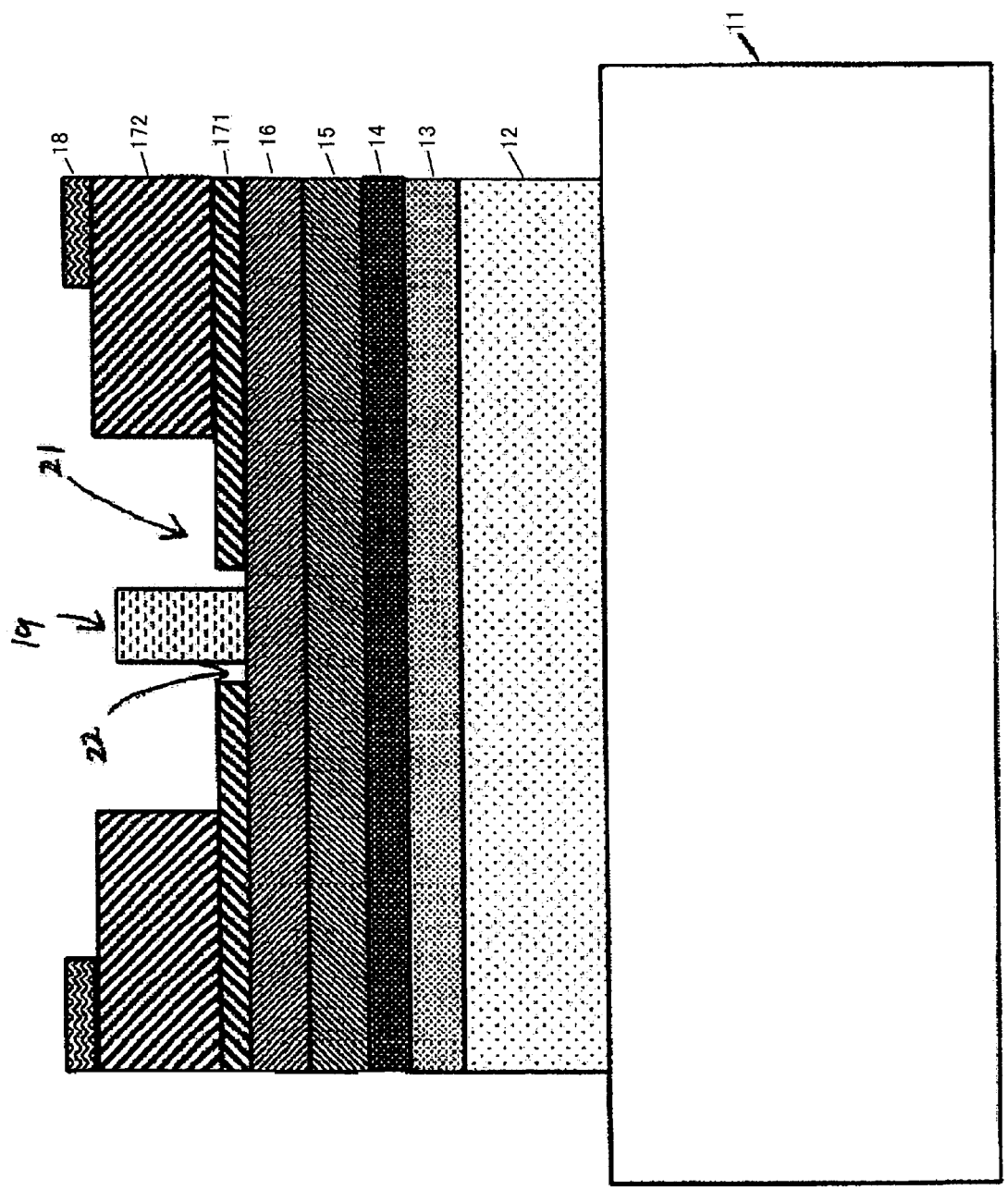
FIG. 4 is a sectional view depicting the field effect transistor according to the second embodiment of the present invention.
Figure 5:
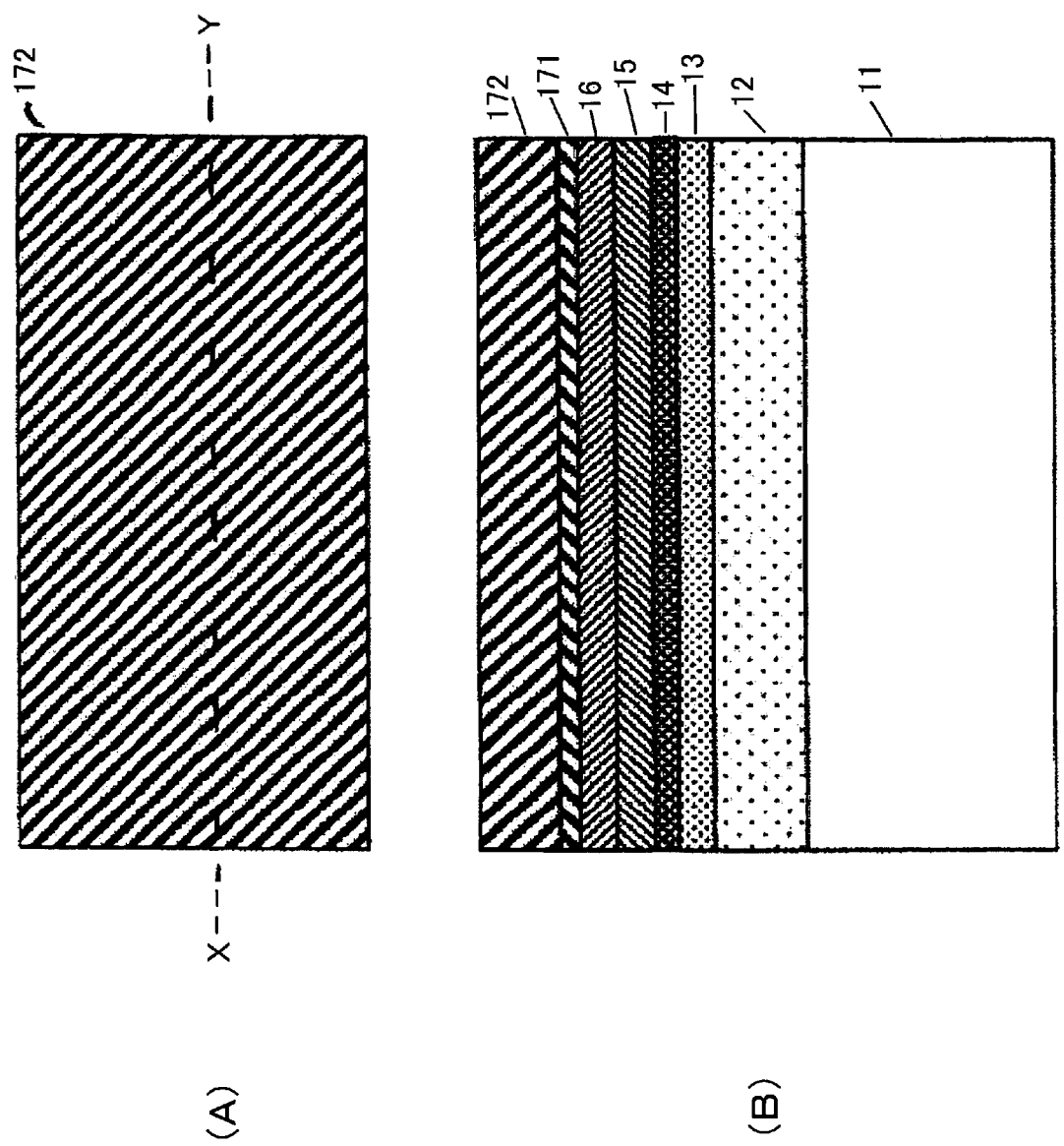
FIG. 5 is a plan view showing a method of manufacturing the field effect transistor according to the second embodiment of the present invention.
Figure 6:
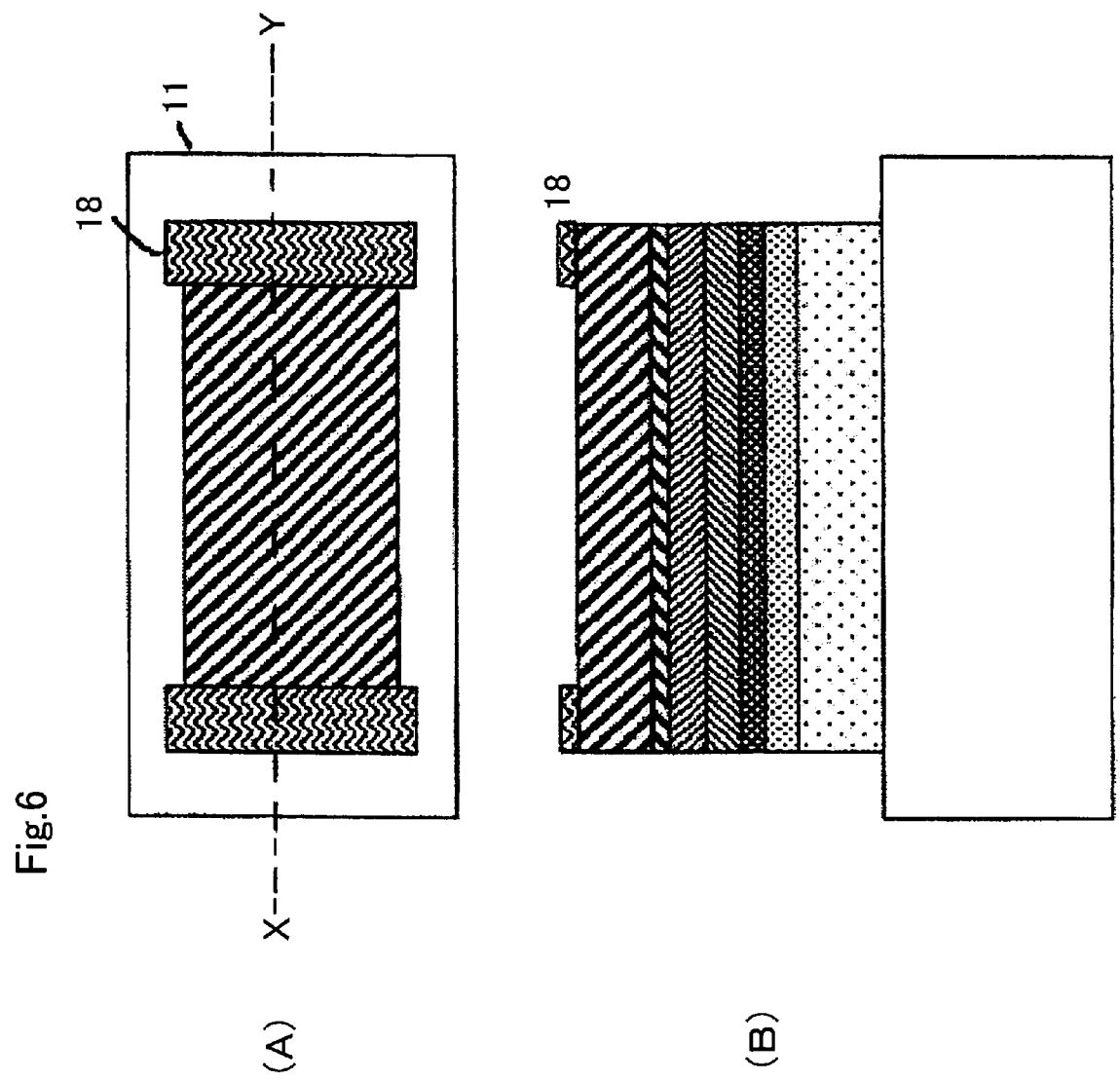
FIG. 6 is a plan view illustrating the method of manufacturing the field effect transistor according to the second embodiment of the present invention.
Figure 7:
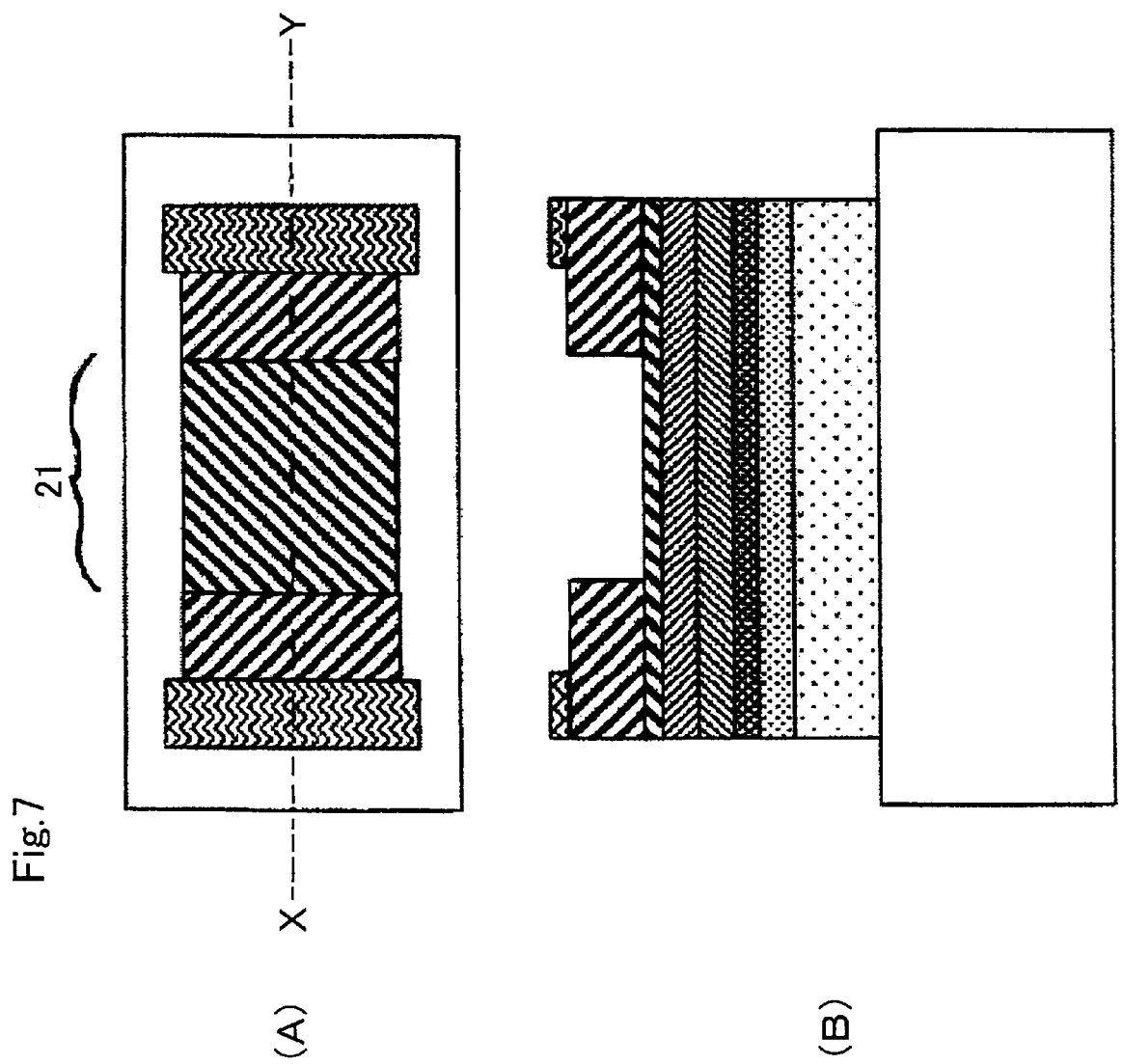
FIG. 7 is a plan view depicting the method of manufacturing the field effect transistor according to the second embodiment of the present invention.
Figure 8:
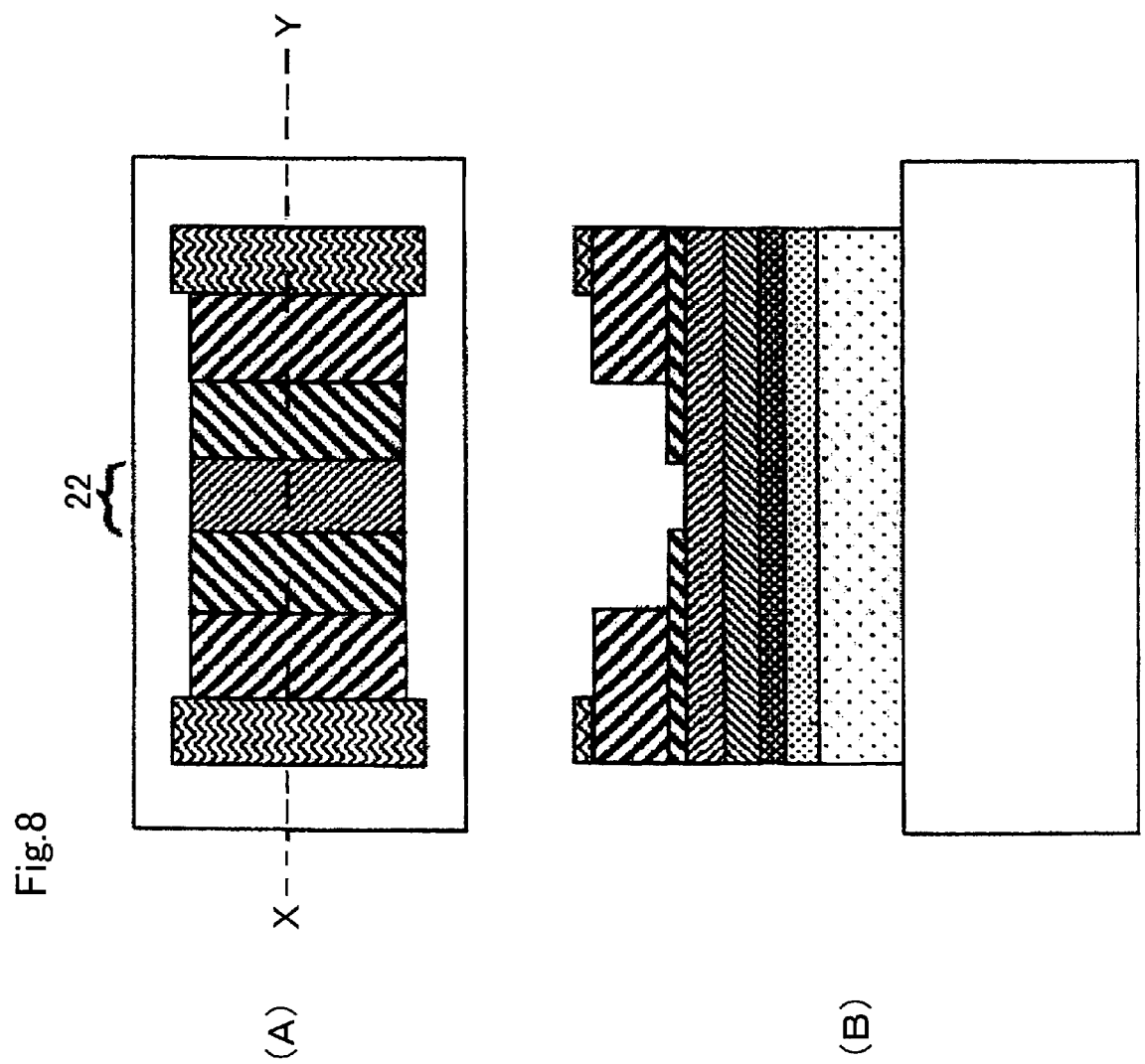
FIG. 8 is a plan view showing the method of manufacturing the field effect transistor according to the second embodiment of the present invention.

FIGS. 3 and 4 are respectively a plan view and a sectional view showing a compound semiconductor FET having a double recess structure, according to a second embodiment of the present invention. FIG. 4 is a cross-section cut along a dotted line X-Y of FIG. 3. The second embodiment of the present invention will be explained below using FIGS. 3 and 4.

The FET according to the second embodiment has a structure wherein an undoped $In_{0.52}Al_{0.48}As$ buffer layer (400 nm thick) 12, an undoped $In_{0.53}Ga_{0.47}As$ channel layer (15 nm thick) 13, an undoped $In_{0.52}Al_{0.48}As$ spacer layer (2 nm thick) 14, an Si doped $In_{0.52}Al_{0.48}As$ carrier supply layer ($1\times10^{19}$ $cm^{-3}$ in concentration and 5 nm in thickness) 15, an undoped $In_{0.52}Al_{0.48}As$ Schottky contact layer (15 nm thick) 16, an Si doped $In_{0.52}Al_{0.48}As$ lower ohmic contact layer ($3\times10^{18}$ $cm^{-3}$ in concentration and 3 nm in thickness) 171, and an Si doped $In_{0.53}Ga_{0.47}As$ upper ohmic contact layer ($3\times10^{18}$ $cm^{-3}$ in concentration and 20 nm in thickness) 172 respectively corresponding to epitaxial layers grown by a molecular beam epitaxial method are sequentially deposited over a substrate 11 comprised of a semi-insulating InP or GaAs.

Further, the FET according to the second embodiment has an outer recess section 21 and an inner recess section 22. The outer recess section 21 is formed by removing the upper ohmic contact layer 172 by etching and thereby exposing the lower ohmic contact layer 171. The inner recess section 22 is formed by further etching-removing the lower ohmic contact layer 171 exposed in the outer recess section 21 and thereby exposing the Schottky contact layer 16.

Ohmic electrodes 18 each made up of AuGe (10 nm thick), Ni (10 nm thick), Au (100 nm thick) and the like are formed on the ohmic contact layers 172 on both sides of the outer recess section 21 with the outer recess section 21 interposed therebetween. A gate electrode 19 made up of Ti (50 nm thick), Pt (50 nm thick), Au (500 nm thick) and the like is formed on the Schottky contact layer 16 lying within the inner recess section 22.

In the FET according to the second embodiment of the present invention, the outer recess section is of an Si doped $In_{0.52}Al_{0.48}As$ ohmic contact layer having a concentration of $3\times10^{18}$ $cm^{-3}$ and a thickness of 3 nm and is configured so as to be perfectly depleted. In particular, the top layer of the outer recess section is of a high-concentration ohmic contact layer. The outer recess section is configured so as to be perfectly depleted. Thus, since a high-concentration space charge is formed in the ohmic contact layer even when the surface level density changes according to the state of the surface of the outer recess section, a change in the width of a depletion layer can be suppressed, thus making it possible to minimize the influence exerted on a channel region.

A method of manufacturing the compound semiconductor FET having the double recess structure, according to the second embodiment of the present invention will next be explained using FIGS. 5(A) and 5(B) through FIGS. 8(A) and 8(B). The respective drawings are plan views and sectional views showing the method of manufacturing the second embodiment of the present invention. The respective figures (B) are respectively sectional views cut along dotted lines X-Y of the respective figures (A).

As shown in FIGS. 5(A) and 5(B), an undoped $In_{0.52}Al_{0.48}As$ buffer layer (400 nm thick) 12, an undoped $In_{0.53}Ga_{0.47}As$ channel layer (15 nm thick) 13, an undoped $In_{0.52}Al_{0.48}As$ spacer layer (2 nm thick) 14, an Si doped $In_{0.52}Al_{0.48}As$ carrier supply layer ($1\times10^{19}$ cm$^{-3}$ in concentration and 5 nm in thickness) 15, an undoped $In_{0.52}Al_{0.48}As$ Schottky contact layer (15 nm thick) 16, an Si doped $In_{0.52}Al_{0.48}As$ lower ohmic contact layer ($3\times10^{18}$ cm$^{-3}$ in concentration and 3 nm in thickness) 171, and an Si doped $In_{0.53}Ga_{0.47}As$ upper ohmic contact layer ($3\times10^{18}$ cm$^{-3}$ in concentration and 20 nm in thickness) 172 are first sequentially deposited over a substrate 11 comprised of a semi-insulating InP or GaAs. The respective layers are of epitaxial layers and their deposition is performed by, for example, a molecular beam epitaxial method.

Next, two ohmic electrodes 18 are formed on the upper ohmic contact layer 172 as shown in FIGS. 6(A) and 6(B).

Subsequently, part of the upper ohmic contact layer 172 corresponding to the portion interposed between the two ohmic electrodes 18 is removed by etching as shown in FIGS. 7(A) and 7(B) to expose the lower ohmic contact layer 171. A portion from which the upper ohmic contact layer 172 is removed results in an outer recess section 21. At this time, the lower ohmic contact layer 171 is used as an etching stopper.

Finally, as shown in FIGS. 8(A) and 8(B), part of the lower ohmic contact layer 171 lying within the outer recess section 21 is further removed by etching to thereby expose the Schottky contact layer 16. A portion from which the lower ohmic contact layer 171 is removed results in an inner recess section 22. Further, an illustrated gate electrode is formed on the Schottky contact layer 16 exposed at the inner recess section 22.

The second embodiment of the present invention has a merit that since the upper ohmic contact layer and the lower ohmic contact layer are different in material from each other, the lower ohmic contact layer can be used as the stopper when the upper ohmic contact layer is removed by etching to form the outer recess section, thereby making it easy to control the characteristic.

While the preferred forms of the present invention have been described, it is to be understood that modifications will be apparent to those skilled in the art without departing from the spirit of the invention. The scope of the invention is to be determined solely by the following claims.

What is claimed is:

1. A field effect transistor comprising:
   a buffer layer;
   a channel layer over the buffer layer;
   a spacer layer over the channel layer;
   a carrier supply layer over the spacer;
   a Schottky contact layer over the carrier supply layer;
   first and second lower ohmic contact layers over the Schottky contact layer;
   a gate electrode disposed between the first and second lower ohmic contact layers;
   a first upper ohmic contact layer directly on the first lower ohmic contact layer; and
   a second upper ohmic contact layer directly on the second lower ohmic contact layer,
   wherein the first and second upper ohmic contact layers are disposed away from the gate electrode and respectively expose top surfaces of the first and second lower ohmic contact layers,
   wherein portions of the first and second lower ohmic contact layers exposed by the first and second upper ohmic contact layers are completely depleted, and
   wherein each of the first and second lower ohmic contact layers is a material different from that of each of the first and second upper ohmic contact layers.

2. The field effect transistor according to claim 1, wherein the first and second lower ohmic contact layers are silicon doped InGaAs layers having a dopant concentration of $3\times10^{18}$ cm$^{-3}$ and a thickness of 3 nm.

3. A method of manufacturing a field effect transistor, comprising:
   sequentially depositing a buffer layer, a channel layer, a spacer layer, a carrier supply layer, a Schottky contact layer, a lower ohmic contact layer and an upper ohmic contact layer over a semiconductor substrate, the lower ohmic contact layer is completely depleted and the upper ohmic contact layer is directly on the lower ohmic contact layer;
   removing part of the upper ohmic contact layer to expose the lower ohmic contact layer, thereby forming an outer recess section;
   removing part of the lower ohmic contact layer lying in the outer recess section to expose the Schottky contact layer, thereby forming an inner recess section; and
   forming a gate electrode over the Schottky contact layer in the inner recess section,
   wherein a material different from that of the upper ohmic contact layer is provided for the lower ohmic contact layer.

4. The method according to claim 3, further comprising providing the lower ohmic contact layer as a silicon doped InGaAs layer having a dopant concentration of $3\times10^{18}$ cm$^{-3}$ and a thickness of 3 nm.

* * * * *